(12) United States Patent
He et al.

(10) Patent No.: US 9,030,883 B2
(45) Date of Patent: May 12, 2015

(54) ADAPTIVE ERASE RECOVERY FOR NON-VOLATILE MEMORY (NVM) SYSTEMS

(71) Applicants: Chen He, Austin, TX (US); Yanzhuo Wang, Austin, TX (US); Fuchen Mu, Austin, TX (US)

(72) Inventors: Chen He, Austin, TX (US); Yanzhuo Wang, Austin, TX (US); Fuchen Mu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 16 days.

(21) Appl. No.: 13/942,814

(22) Filed: Jul. 16, 2013

(65) Prior Publication Data

US 2015/0023106 A1    Jan. 22, 2015

(51) Int. Cl.
*G11C 11/34* (2006.01)
*G11C 16/06* (2006.01)

(52) U.S. Cl.
CPC .................................. *G11C 16/06* (2013.01)

(58) Field of Classification Search
CPC ............................ G11C 16/0483; G11C 16/10
USPC ........................................ 365/185.19, 185.24
See application file for complete search history.

(56) References Cited

U.S. PATENT DOCUMENTS

| | | | |
|---|---|---|---|
| 5,963,473 A | 10/1999 | Norman | |
| 6,792,065 B2 * | 9/2004 | Maletsky | ......................... 377/34 |
| 7,542,351 B2 * | 6/2009 | Choy et al. | ............... 365/185.25 |
| 7,945,825 B2 | 5/2011 | Cohen et al. | |
| 8,296,337 B2 * | 10/2012 | Flynn et al. | ................... 707/813 |
| 8,671,249 B2 * | 3/2014 | Talagala et al. | ............... 711/154 |

* cited by examiner

*Primary Examiner* — Michael Tran
(74) *Attorney, Agent, or Firm* — Egan, Peterman & Enders LLP

(57) ABSTRACT

Methods and systems are disclosed for adaptive erase recovery of non-volatile memory (NVM) cells within NVM systems. The adaptive erase recovery embodiments adaptively adjust the erase recovery discharge rate and/or discharge time based upon the size of NVM block(s) being erased and operating temperature. In one example embodiment, the erase recovery discharge rate is adjusted by adjusting the number of discharge transistors enabled within the discharge circuitry, thereby adjusting the discharge current for erase recovery. A lookup table is used to store erase recovery discharge rates and/or discharge times associated with NVM block sizes to be recovered and/or operating temperature. By adaptively controlling erase recovery discharge rates and/or times, the disclosed embodiments improve overall erase performance for a wide range of NVM block sizes while avoiding possible damage to high voltage circuitry within the NVM system.

20 Claims, 5 Drawing Sheets

US 9,030,883 B2

ADAPTIVE ERASE RECOVERY FOR NON-VOLATILE MEMORY (NVM) SYSTEMS

TECHNICAL FIELD

This technical field relates to non-volatile memory (NVM) systems and, more particularly, to erase and erase recovery operations for NVM cells within NVM systems.

BACKGROUND

Non-volatile memory (NVM) systems are used in a variety of electronic systems and devices. During erase operations for NVM systems, erase pulses are applied to all NVM bit cells in selected block(s), where the body (e.g., well or substrate) of the bit cells is biased to a high positive voltage (e.g., 8.5 volts), and where the gates of the bit cells are biased to a high negative voltage (e.g., −8.5 volts). After each erase pulse completes, an erase recovery operation is performed to discharge the body and gates of the bit cells to target voltage levels (e.g., 3.3 volts and ground, respectively) in order to allow subsequent NVM operations, such as read and verify operations, to proceed safely.

For erase recovery, the size of the NVM block(s) being erased forms an equivalent capacitor between the gate node and the body of the NVM bit cells, thereby affecting how fast the nodes are discharged to target voltages. Operating temperature for the NVM system also impacts the erase recovery rate by impacting device leakage and the strength of bias pump circuitry within the NVM system. If the erase recovery occurs too fast, coupling between the two high voltage nodes being discharged can potentially cause an overshoot of one high voltage node, thereby causing damage to transistor devices in the NVM circuitry. If the erase recovery occurs too slow, higher than expected voltages can be left on the body or gate nodes of the NVM cells, thereby causing hot switching of the high voltage level shifter circuits in subsequent NVM operations that can damage the devices in the NVM circuitry. However, if a large amount of time is allocated for the total erase recovery process to accommodate the too-slow erase recovery rate, the resulting time delay can adversely impact erase performance of the NVM system.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Methods and systems are disclosed for adaptive erase recovery of non-volatile memory (NVM) cells within NVM systems. The adaptive erase recovery embodiments described herein adaptively adjust the erase recovery discharge rate and/or the erase recovery discharge time based upon the size of NVM block(s) being erased and/or operating temperature of the NVM system. In one example embodiment, the erase recovery discharge rate is adjusted by adjusting the number of discharge transistors enabled within the discharge circuitry, thereby adjusting the discharge current for erase recovery. A lookup table is used to store erase recovery discharge rates and/or discharge times associated with NVM block sizes to be recovered and operating temperature. By adaptively controlling erase recovery discharge rates and/or discharge times, the disclosed embodiments resolve overshoot problems resulting from too-fast erase recovery rates and also improve overall erase performance for a wide range of NVM block sizes while avoiding possible damage to high voltage circuits within the NVM system. Different features and variations can be implemented, as desired, and related or modified systems and methods can be utilized, as well.

Figure 1:
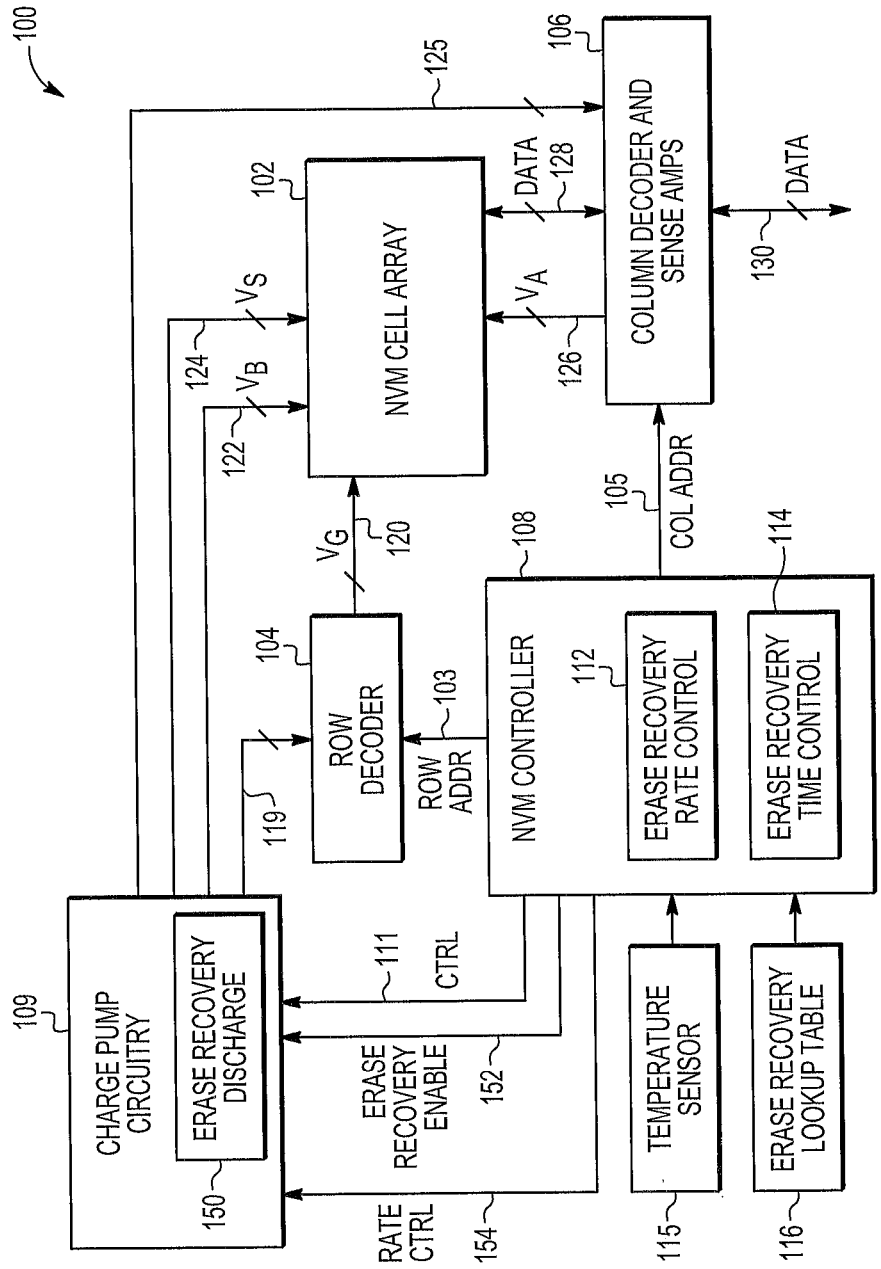
FIG. 1 is a block diagram of an example embodiment for a non-volatile memory (NVM) system including adaptive erase recovery.

FIG. 1 is a block diagram of an example embodiment for a non-volatile memory (NVM) system 100 with adaptive erase recovery for NVM cells within the NVM system. For the embodiment depicted, the NVM system 100 includes an NVM cell array 102, a row decoder 104, column decoder and sense amplifiers (amps) 106, an NVM controller 108, charge pump circuitry 109, temperature sensor 115, and erase recovery lookup table 116. It is also noted that NVM cells are typically grouped in NVM blocks, and an NVM block is often the minimum unit for erase operation. An NVM erase operation is usually a mass operation in that all the NVM cells of the selected blocks will receive the erase pulses and go through erase recovery together. Further, multiple NVM blocks can typically be selected and erased in parallel. The charge pump circuitry 109 includes erase recovery discharge circuitry 150, and the NVM controller 108 includes an erase recovery rate control block 112 and an erase recovery time control block 114. The erase recovery discharge circuitry 150, the erase recovery rate control block 112, and the erase recovery time control block 114 are used to provide adaptive erase recovery for the NVM system 100, as described in more detail herein. The blocks within NVM system 100 can be integrated within one or more integrated circuits, as desired, and external circuitry can be utilized as well.

To access NVM cells during operation, the NVM controller 108 provides row addresses 103 to the row decoder 104 and column addresses 105 to the column decoder and sense amplifier circuitry 106. The row decoder 108 drives rows within the NVM cell array 102 based upon the row addresses 103 by applying gate bias voltages ($V_G$) 120 to NVM cells within selected rows. The column decoder and sense amplifier circuitry 106 drives selected columns within the NVM cell array 102 based upon the column addresses 105 through drain bias voltages ($V_D$) 126 applied to NVM cells within selected columns. For a read operation, data from the NVM cell array 102 is provided to column decoder and sense amplifier circuitry 106 through connections 128, and these read data can be output as data through connections 130 for further use and/or processing. For a program operation, data received by column decoder and sense amplifier circuitry 106 through connections 130 can be provided to NVM cell array 102 through connections 128. Other NVM operations can also be performed, such as read verify operations, program verify operations, erase operations, erase recovery operations, and/or other desired NVM operations. During NVM operations, body bias voltages ($V_B$) 122 and source bias voltages ($V_S$) 124 are also be applied to the NVM cell array 102 in additional to gate bias voltages ($V_G$) 120 and drain bias voltages ($V_D$) 126.

It is noted that the charge pump circuitry 109 is configured to generate the different bias voltages applied to the NVM cells within the NVM cell array 102 during the NVM operations. For example, for the embodiment depicted, the charge pump circuitry 109 generates body bias voltages ($V_B$) 122 and source bias voltages ($V_S$) 124. The charge pump circuitry 109 also generates row bias voltages 119 that are used by the row decoder 104 to apply the gate bias voltages ($V_G$) 120 to the NVM cell array 102. The charge pump circuitry 109 further generates column bias voltages 125 that are used by the column decoder and sense amplifier circuitry 106 to apply the drain bias voltages ($V_D$) 126 to the NVM cell array 102. The charge pump circuitry 109 receives control signals (CTRL) 111 from the NVM controller 108 that control the bias voltages being generated by the charge pump circuitry 109. Further, as described herein, the charge pump circuitry 109 also receives rate control (RATE CTRL) signals 154 and erase recovery enable signals 152 that control the rate and allowed discharge time for the erase recovery discharge circuitry 150.

The bias voltages generated by the charge pump circuitry 109 are adjusted or controlled based upon the NVM operations being performed by the NVM system. As indicated above, NVM operations can include read operations, read verify operations, program operations, program verify operations, erase operations, erase recovery operations, and/or other desired NVM operations. The charge pump circuitry 109 can generate multiple different voltage levels for each bias voltage, as needed, depending upon the NVM operation being performed. Further, the charge pump circuitry 109 can be implemented as a single circuit block or as circuit blocks distributed in different locations throughout the NVM system 100, as desired.

As described herein, to avoid voltage overshoot and to reach desired target voltages during erase recovery operations for the NVM system 100, erase recovery discharge rates and/or the erase recovery discharge times are adaptively controlled. The erase recovery rate control block 112 is utilized to control the erase recovery discharge circuitry 150 so that selected discharge rates are achieved during erase recovery operations for the NVM system 100. The erase recovery time control block 114 is utilized to determine and control the discharge time for erase recovery operations so that the erase recovery operation has a selected duration. As the discharge rate can be affected by the operating temperature of the NVM system and the block size (e.g., the number of cells in the block) being recovered, the erase recovery lookup table 116 is configured to store data representing discharge rates to be used for erase recovery depending upon operating temperatures and numbers of NVM cells to be recovered. The erase recovery lookup table 116 can also be configured to store data representing discharge times to be used for erase recovery depending upon operating temperatures and numbers of NVM cells to be recovered. These discharge rates and/or discharge times are selected and used by the erase recovery rate control block 112 and the erase recovery time control block 114 to adaptively adjust the erase recovery discharge circuitry 150 to achieve selected discharge rates and discharge times for the erase recovery operation. It is noted that the erase recovery discharge time refers to the maximum allowed time for the erase recovery to complete, and erase recovery completes successfully when the biases discharge to the target voltage levels. Once the biases reach the target discharge levels, they will remain at those levels.

When an erase recovery operation is to be performed on NVM cells within the NVM cell array 102, the NVM controller 108 accesses the erase recovery lookup table 116 and selects discharge rates/times based upon the number of NVM cells to be recovered and the operating temperature for the NVM system 100. The operating temperature can be obtained from the temperature sensor 115 or from another desired source indicating an operating temperature associated with the NVM system. The erase recovery rate control block 112 utilizes the selected discharge rate to provide rate control signals 154 to adjust the discharge rate provided by the erase recovery discharge circuitry 150. The erase recovery time control block 114 utilizes the selected discharge time to adjust the maximum allowed discharge time for the erase recovery operation. The data stored within the lookup table can be determined by design simulation prior to production and then further tuned based on post-production characterization, if desired. Other techniques could also be utilized to generate the discharge rates/times stored within the lookup table. Further, the lookup table can be implemented as programmable circuitry within the NVM system that can be programmed after production of the integrated circuit including the NVM system. The lookup table can also be implemented as a read-only-memory that is formed during production of the integrated circuit. Still further, the lookup table can be adjusted based on silicon characterization and stored in a dedicated block of NVM cells during production test. Other variations could be implemented.

Figure 2:
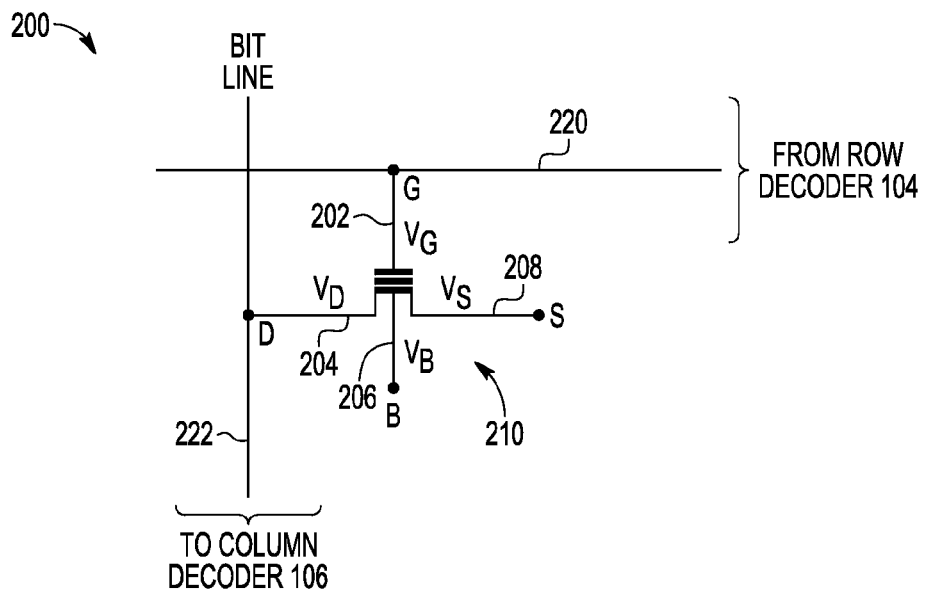
FIG. 2 is a circuit diagram of an example embodiment for connections to a non-volatile memory (NVM) cell.

FIG. 2 is a connection diagram of an example embodiment 200 for an NVM cell 210 within the NVM cell array 102. During an operation, the NVM cell 210 has its body (B) 206 connected to a body bias voltage ($V_B$) and has its source (S) 208 connect to a source bias voltage ($V_S$). The NVM cell 210 has its drain (D) 204 coupled to the column decoder 106 through a bit-line connection 222 to receive a drain bias voltage ($V_D$). The NVM cell 210 has its gate (G) 202 coupled to the row decoder 118 through a row connection 220 to receive a gate bias voltage ($V_G$). Depending upon the operation to be performed for the NVM cell 210, different body, source, drain, and gate bias voltages ($V_B$, $V_S$, $V_D$, $V_G$) are applied to the NVM cell 210 based upon bias voltages generated by charge pump circuitry 109. It is noted that for a floating gate NVM cell, a dielectric layer, a floating gate, and a tunnel dielectric layer will typically be located below the gate (G) node 202 (e.g., gate electrode for the NVM cell 210) and above a channel region within the semiconductor substrate upon which the floating gate NVM cell is fabricated. It is noted that other types of NVM cells could also be utilized, such as split-gate NVM cells, multi-level NVM cells, and/or other types of NVM cells, if desired.

During erase pulses for the NVM system, the gate bias voltage ($V_G$) is set to a large negative voltage (e.g., −8.5 volts), and the body bias voltage ($V_B$) is set to a large positive voltage (e.g., 8.5 volts). The drain bias voltage ($V_D$) and the source bias voltage ($V_S$) are allowed to float. After an erase pulse operation completes, an erase recovery operation can be applied to the NVM cells that were erased. During these erase recovery operations, the gate bias voltage ($V_G$) is discharged from the large negative voltage to a smaller magnitude target voltage at a discharge rate, and the body bias voltage ($V_B$) is discharged from the large positive voltage to a smaller magnitude target voltage at a discharge rate. The discharge rates for the gate bias voltage ($V_G$) and the body bias voltage ($V_B$), as well as the time period allowed for the discharge, affect whether or not the erase recovery operation operates within desired parameters. The discharge rates can also be the same, or they can be different, as desired.

Figure 3:
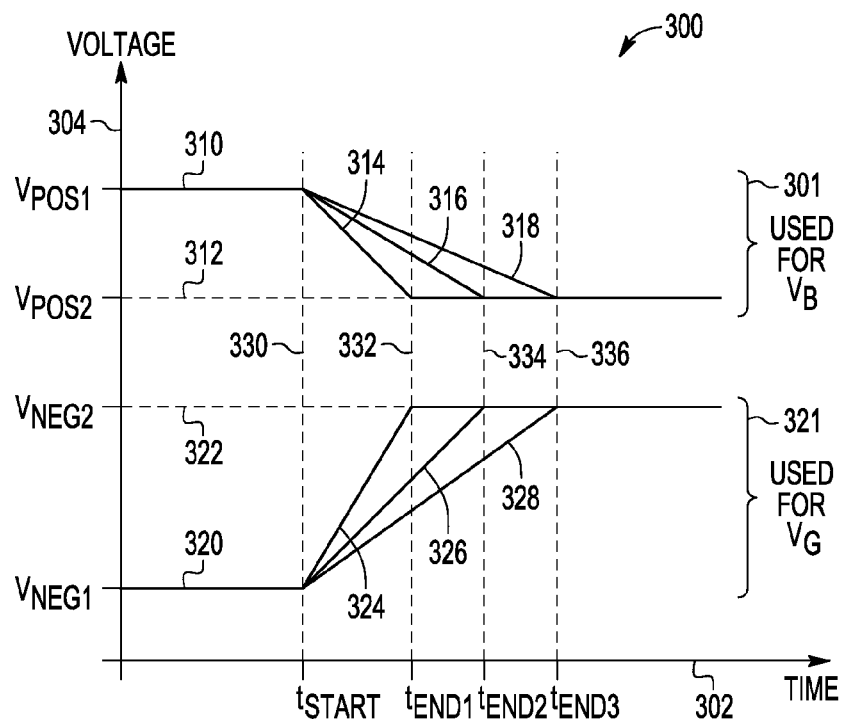
FIG. 3 is a signal diagram of an example embodiment for adaptive control of erase recovery for NVM cells within an NVM system.

FIG. 3 is a signal diagram of an example embodiment 300 for adaptive control of erase recovery for NVM cells within the NVM system 100. The x-axis 302 represents time, and the y-axis 304 represents voltage. Positive voltages ($V_{POS}$) 301 are associated with body bias voltage ($V_B$), and negative voltages ($V_{NEG}$) 321 are associated with gate bias voltage ($V_G$). Looking first to positive voltages 301, the voltage ($V_{POS1}$) 310 represents the initial starting voltage (e.g., 8.5 volts) for the erase recovery operation. The voltage ($V_{POS2}$) 312 represents a target voltage (e.g., 3.3 volts) for the end of the erase recovery operation. The time ($t_{START}$) 330 represents the beginning of a discharge of the initial large positive voltage level. Voltage discharge ramps 314, 316, and 318 represent three different voltage discharge rates for the positive voltage ($V_{POS}$). Looking next to negative voltages 321, the voltage ($V_{NEG1}$) 320 represents the initial starting voltage (e.g., −8.5 volts) for the erase recovery operation. The voltage ($V_{NEG2}$) 322 represents a target voltage (e.g., ground) for the end of the erase recovery operation. The time ($t_{START}$) 330 represents the beginning of a discharge of the initial large negative voltage level. Voltage discharge ramps 324, 326, and 328 represent three different voltage discharge rates for the negative voltage ($V_{NEG}$). The first end time ($t_{END1}$) 332 is associated with the first discharge ramps 314 and 324. The second end time ($t_{END2}$) 334 is associated with the second discharge ramps 316 and 326. The third end time ($t_{END3}$) 336 is associated with the third discharge ramps 318 and 328. The end times 332, 334, and 336 allow for the voltage levels to reach their target voltage levels 312 and 322, respectively. It is noted that the negative and positive voltages may discharge to the target voltage at different times and/or at different rates, if desired, although for simplicity, it is shown in embodiment 300 that the negative and positive voltages recover to the target voltage at the same time and at similar rates.

For the embodiments described herein, the discharge rates are adaptively selected based upon the operation conditions of the NVM system 100. In addition, the discharge times can also be adaptively selected based upon the operation conditions of the NVM system 100. As the number of NVM cells in selected block(s) being recovered during erase recovery affects the discharge rate for the NVM cells during erase recovery, the number of NVM cells in selected block(s) being recovered can be utilized to select and adjust the discharge rate. Further, as temperature affects the discharge rate for the NVM cells during erase recovery, a temperature measurement associated with the operating temperature of the NVM system can also be utilized to select and adjust the discharge rate. Further, as adjustments to the discharge rate will affect the discharge time needed to reach target voltage levels, the discharge time for the erase recovery operation can also be adjusted based upon the selected discharge rate, number of NVM cells being recovered and/or operating temperature.

TABLE 1 below provides a representative example embodiment of an erase recovery lookup table that includes discharge rates and discharge times associated with operating temperatures and numbers of NVM cells being recovered during the erase recovery operation.

TABLE 1

EXAMPLE ERASE RECOVERY LOOKUP TABLE

| Number of Cells | Temperature | Discharge Rate | Discharge Time |
|---|---|---|---|
| SIZE1 | <T1 | RATE1 | TIME1 |
| SIZE1 | T1 to T2 | RATE2 | TIME2 |
| SIZE1 | >T2 | RATE3 | TIME3 |
| ... | ... | ... | ... |
| SIZE(N) | <T1 | RATE4 | TIME4 |
| SIZE(N) | T1 to T2 | RATE5 | TIME5 |
| SIZE(N) | >T2 | RATE6 | TIME6 |

It is noted that the erase recovery lookup table can be organized and indexed, as desired, while still providing discharge rates and/or discharge times associated with operating temperature and numbers of NVM cells being recovered. It is further noted that ranges, such as temperature ranges or cell size ranges, can also be utilized, as desired. In addition, the erase recovery operation can be performed on all NVM cells in selected block erased during an erase operation or can be performed on a subset of the NVM cells, as desired. For example, if erase operations are being performed on multiple blocks of NVM cells, the erase recovery can be performed on one or more of these blocks at a time, thereby reducing a number of NVM cells being recovered in a particular erase recovery operation. Still further, the lookup table can be configured to include numbers of NVM cells and discharge rates without including operating temperature and discharge times. Other variations could also be implemented.

Figure 4:
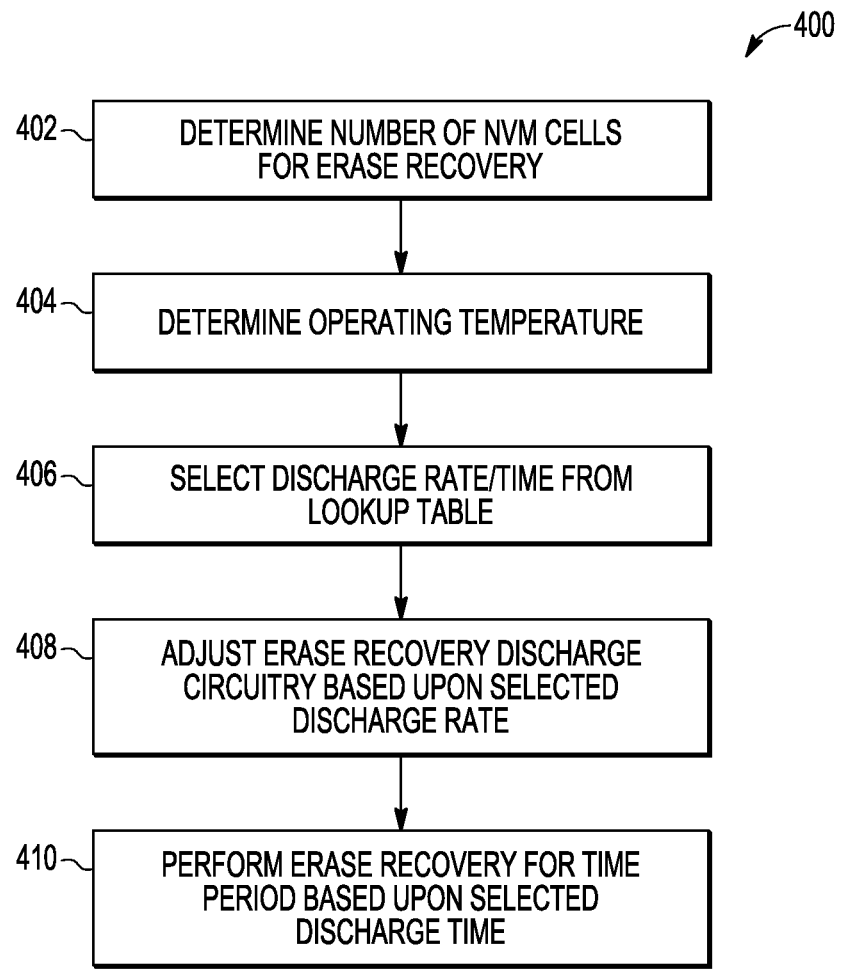
FIG. 4 is a process diagram of an example embodiment for adaptive control of erase recovery for NVM cells within the NVM system.

FIG. 4 is a process diagram of an example embodiment 400 for adaptive control of erase recovery for NVM cells within the NVM system 100. In block 402, a number of NVM cells to be recovered during the erase recovery operation is determined. In block 404, an operating temperature is determined. In block 406, a discharge rate and a discharge time are selected from an erase recovery lookup table based upon the number of NVM cells to be recovered and the operating temperature. In block 408, erase recovery discharge circuitry is adjusted based upon the selected discharge rate. In block 410, the erase recovery operation is performed for a time period based upon the selected discharge time. It is noted that additional and/or different steps could be implemented, if desired, while still providing adaptive erase recovery for NVM cells within the NVM system. For example, if only a discharge rate is selected based upon a number of NVM cells to be recovered, block 404 could be removed, and block 406 would be performed only select a discharge rate. Other variations could be implemented, as desired.

Figure 5:
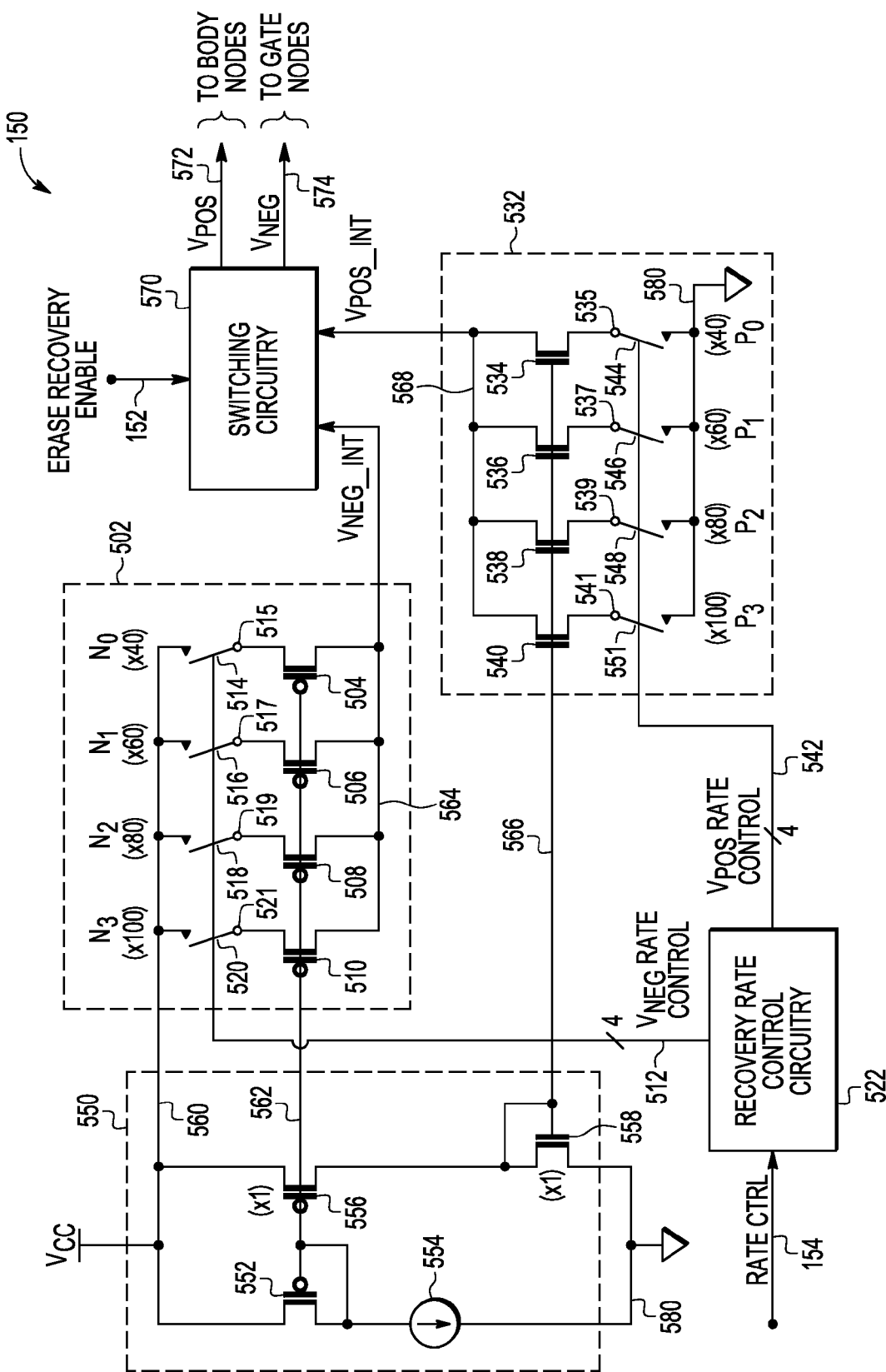
FIG. 5 is a circuit diagram of an example embodiment for adaptive erase recovery discharge circuitry.

FIG. 5 is a circuit diagram of an example embodiment for erase recovery discharge circuitry 150. For the embodiment depicted, switching circuitry 570 receives the erase recovery enable signal 152, and recovery rate control circuitry 522 receives the discharge rate control signal 154. The recovery rate control circuitry 522 provides a negative voltage rate control signal 512 (e.g., 4 bits) to the negative voltage discharge bias circuitry 502, which provides the negative bias voltage ($V_{NEG\_INT}$) to the switching circuitry 570. The recovery rate control circuitry 522 also provides a positive voltage rate control signal 542 (e.g., 4 bits) to the positive voltage discharge bias circuitry 532, which provides the positive bias voltage ($V_{POS\_INT}$) to the switching circuitry 570. As described herein, the negative bias voltage ($V_{NEG}$) 572 is connected to body nodes during erase recovery, and the positive bias voltage ($V_{POS}$) 574 is connected to gate nodes during erase recovery.

The current bias circuitry 550 provides a current bias signal 562 to the negative voltage discharge bias circuitry 502 and a current bias signal 566 to the positive voltage discharge bias circuitry 532. The current bias circuitry includes current source 554 (e.g., 8 micro-Amps), which can be generated by any desired method, and transistors 552, 556, and 558. Current source 554 is coupled between transistor 552 and ground 580. Transistor 552 has its source and drain coupled between the voltage supply node ($V_{CC}$) 560 and a current source 554, and transistor 552 has its gate coupled to its drain. Transistor 556 has its gate coupled to the gate of transistor 552, has its source coupled to the supply voltage node 560, and has its drain coupled to the drain of transistor 558. The gates of transistors 552 and 556 are coupled together and provide the current bias signal 562 to the gates of transistors 504, 506, 508, and 510. Transistor 558 has its source coupled to ground 580, and its gate provides the current bias signal 566 to the gates of transistors 534, 536, 538, and 540. It is noted that transistors 552 and 556 can be PMOS transistors, and transistor 558 can be an NMOS transistor. Variations could be implemented, if desired.

The negative voltage discharge bias circuitry 502 includes four parallel sets of switches 514, 516, 518, and 520 and transistors 504, 506, 508, and 510 that are coupled between voltage supply ($V_{CC}$) node 560 and node 564. Node 564 then provides the negative bias voltage ($V_{NEG\_INT}$) to the switching circuitry 570. In particular, the switch 520 is coupled between supply node 560 and node 521, and transistor 510 is coupled between node 521 and node 564. The switch 518 is coupled between supply node 560 and node 519, and the transistor 508 is coupled between node 519 and node 564. The switch 516 is coupled between supply node 560 and node 517, and transistor 506 is coupled between node 517 and node 564. The switch 514 is coupled between supply node 560 and node 515, and transistor 504 is coupled between node 515 and node 564. As depicted, the transistors 504, 506, 508, and 510 are weighted with respect to master transistor device 552. For the embodiment depicted, transistor 556 is assumed to have a nominal weight (e.g., x1) with respect to master transistor device 552. Transistor 504 can provide a smallest weight (e.g., x40), and transistor 510 can provide the largest weight (e.g., x100). Transistor 506 can provide a first intervening weight (e.g., x60), and transistor 508 can provide a second intervening weight (e.g., x80). Also as depicted, each of the switches 514, 516, 518, and 520 receive one bit of the negative voltage rate control signal 512, which is a multiple bit control signals. For the four-bit embodiment depicted, the least significant bit ($N_0$) is applied to switch 514. The next bit ($N_1$) is applied to switch 516. The next bit ($N_2$) is applied to switch 518. And the most significant bit ($N_3$) is applied to switch 520. As such, the negative voltage rate control signal ($N_3$:$N_0$) 512 controls the switches 514, 516, 518, and 520 and thereby determines which of the transistors 504, 506, 508, and 510 are included or removed within the circuit path from the voltage supply node 560 to node 564. It is noted that the source/drains for transistors 504, 506, 508, and 510 are coupled between node 564 and the switches 514, 516, 518, and 520. Variations could be implemented, if desired.

Similarly, the positive voltage discharge bias circuitry 532 includes four parallel sets of switches 544, 546, 548, and 551 and transistors 534, 536, 538, and 540 that are coupled between ground node 580 and voltage node 568. Node 568 then provides the positive bias voltage ($V_{POS\_INT}$) to the switching circuitry 570. In particular, the switch 551 is coupled between ground 580 and node 541, and transistor 540 is coupled between node 541 and node 568. The switch 548 is coupled between ground 580 and node 539, and transistor 538 is coupled between node 539 and node 568. The switch 546 is coupled between ground 580 and node 537, and transistor 536 is coupled between node 537 and node 568. The switch 544 is coupled between ground 580 and node 535, and transistor 534 is coupled between node 535 and node 568. As depicted, the transistors 534, 536, 538, and 540 are weighted with respect to master transistor 558. For the embodiment depicted, transistor 558 is assumed to have a nominal weight (e.g., x1) with respect to master transistor device 552. The transistor 534 can provide a smallest weight (e.g., x40), and transistor 540 can provide the largest weight (e.g., x100). Transistor 536 can provide a first intervening weight (e.g., x60), and transistor 538 can provide a second intervening weight (e.g., x80). Also as depicted, each of the switches 544, 546, 548, and 551 receive one bit of the positive voltage rate control signal 542, which is a multiple bit control signal. For the four-bit embodiment depicted, the least significant bit ($P_0$) is applied to switch 544. The next bit ($P_1$) is applied to switch 546. The next bit ($P_2$) is applied to switch 548. And the most significant bit ($P_3$) is applied to switch 551. As such, the positive voltage rate control signal ($P_3$:$P_0$) 542 controls the switches 544, 546, 548, and 551 and thereby determines which of the transistors 534, 536, 538, and 540 are included or removed within the circuit path from the ground node 580 to node 568. It is noted that the source/drains for transistors 534, 536, 538, and 540 are coupled between node 568 and the switches 514, 516, 518, and 520. Variations could be implemented, if desired.

It is noted that different numbers of control bits can be utilized, and different numbers of associated switch/transistor pairs could be utilized, as desired. It is also noted that transistors 504, 506, 508, and 510 can be implemented as PMOS transistors. Switches 514, 516, 518, and 520 can be implemented as PMOS transistors. Transistors 534, 536, 538, and 540 can be implemented as NMOS transistors. And switches 544, 546, 548, and 551 can also be implemented as NMOS transistors. Variations could be implemented, if desired.

TABLE 2 below provides example discharge rates that can be used with respect to the example embodiment of FIG. 5, which uses four-bit control signals for controlling discharge rate. As described above, the four-bit control signals 512 and 542 select which of four different drive transistors are included within operation of the discharge bias circuitry. The top row indicates block sizes for the number of NVM cells being recovered, which range from 16 kilobytes (KB) to 8 megabytes (MB). The left row indicates the operating temperature for the NVM cells, which includes a hot, medium, and cold temperature ranges. Other sizes, temperatures, temperature ranges, and control signals could be utilized. Further, it is noted that to avoid overshoot, a slower erase recovery rate is typically desired for larger NVM cell block sizes. Thus, a smaller number of enabled discharge transistors and thereby a smaller discharge current is utilized for larger array sizes. Conversely, larger number of enabled discharge transistors and thereby a larger discharge current is utilized for smaller NVM cell block sizes.

TABLE 2

EXAMPLE DISCHARGE RATES

|  | 16 KB 32 KB 64 KB | 128 KB 256 KB | 1 MB | 2 MB | 4 MB | 8 MB |
|---|---|---|---|---|---|---|
| Hot Temp Range | 1110 | 1110 | 1010 | 0110 | 0101 | 0010 |
| Med Temp | 1110 | 1110 | 1011 | 0111 | 0110 | 0100 |

TABLE 2-continued

EXAMPLE DISCHARGE RATES

| | 16 KB 32 KB 64 KB | 128 KB 256 KB | 1 MB | 2 MB | 4 MB | 8 MB |
|---|---|---|---|---|---|---|
| Range | | | | | | |
| Cool Temp Range | 1111 | 1101 | 1101 | 1011 | 0111 | 1000 |

With respect to TABLE 2, it is assumed that the negative control signals ($N_3$:$N_0$) 512 for the negative voltage discharge bias circuitry 502 will be configured to match the positive control signals ($P_3$:$P_0$) 542 for the positive voltage discharge bias circuitry 532. However, different discharge rates and associated controls signals could be used for the negative control signals ($N_3$:$N_0$) 512 and the positive control signals ($P_3$:$P_0$) 542, if desired. Further, it is noted that the control signals are provided assuming that a logic "1" includes a drive transistor and that a logic "0" removes a drive transistor, as would be the case for NMOS switch transistors. If PMOS switch transistors are utilized, then the control signals can be inverted prior to be applied to the PMOS switch transistors.

TABLE 3 below provides example discharge times that can be used for the example embodiment of FIG. 5. As described herein, the discharge times are controlled by the erase recovery enable signals 152 applied to the switching circuitry 570. The top row indicates block sizes for the number of NVM cells being recovered, which range from 16 kilobytes (KB) to 8 megabytes (MB). The left row indicates the operating temperature for the NVM cells, which includes a hot, medium, and cold temperature ranges. Other sizes, temperatures, temperature ranges, and discharge times could be utilized.

TABLE 3

EXAMPLE DISCHARGE TIMES

| | 16 KB 32 KB 64 KB | 128 KB 256 KB | 1 MB | 2 MB | 4 MB | 8 MB |
|---|---|---|---|---|---|---|
| Hot Temp Range | 10 μs | 20 μs | 160 μs | 320 μs | 640 μs | 1280 μs |
| Med Temp Range | 10 μs | 15 μs | 120 μs | 240 μs | 480 μs | 960 μs |
| Cool Temp Range | 10 μs | 10 μs | 80 μs | 160 μs | 320 μs | 640 μs |

For the example embodiment of TABLE 3, discharge times from 10 microseconds (μs) to 1280 μs are provided based upon the number of NVM cells being recovered and the operating temperature. As seen in TABLE 3, larger discharge times are allocated for larger NVM cell block sizes, and shorter discharge times are allocated for smaller NVM cell block sizes.

Figure 6:
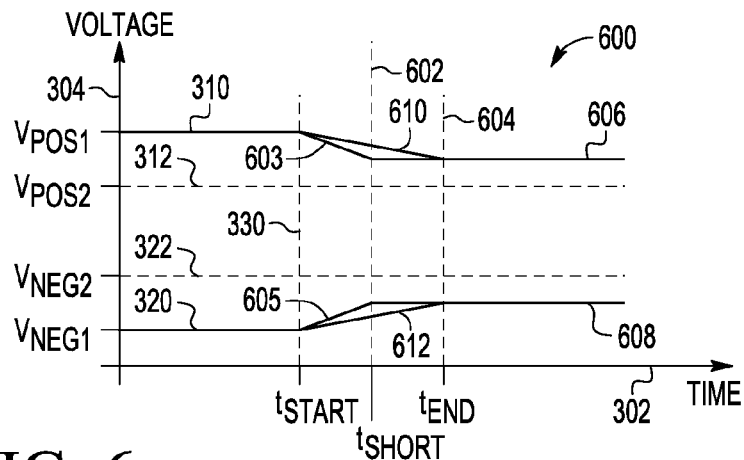
FIG. 6 is a timing diagram of an embodiment where the discharge rate is too slow or where the discharge time is too short.
Figure 7:
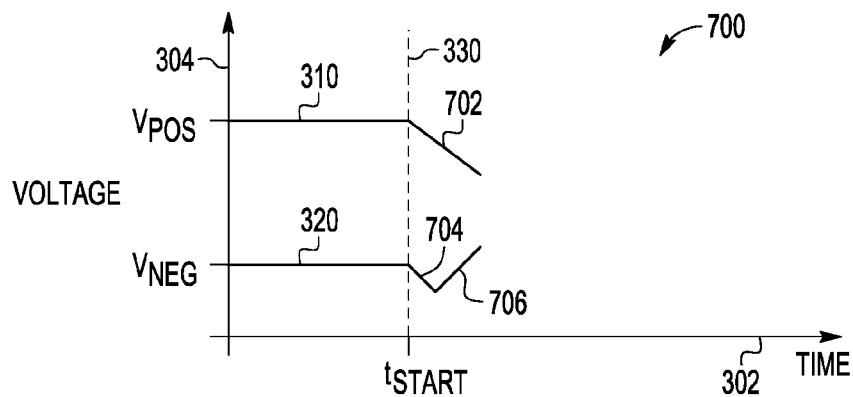
FIG. 7 is a timing diagram of an embodiment where a negative voltage overshoots due to a positive voltage discharge rate being too fast.
Figure 8:
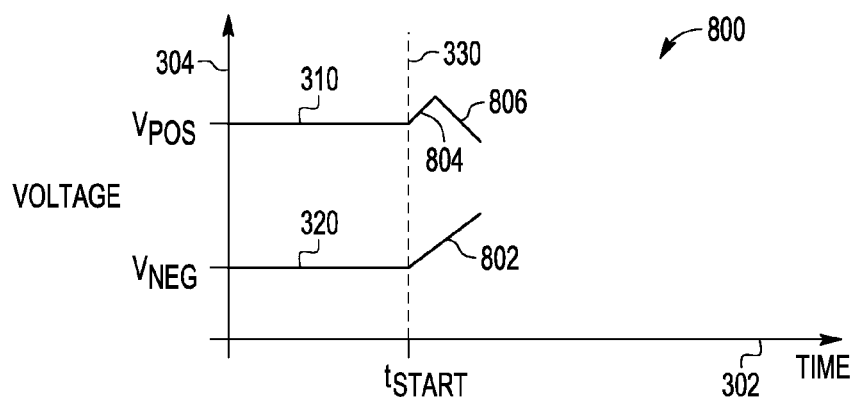
FIG. 8 is a timing diagram of an embodiment where a positive voltage overshoots due to a negative voltage discharge rate being too fast.

FIGS. 6-8 are now considered. These figures provide examples for voltage overshoot errors and discharge time errors that can be avoided using the adaptive erase recovery embodiments described herein.

FIG. 6 is a timing diagram of an embodiment 600 where the discharge rate is too slow or where the maximum allowed discharge time is too short. As depicted, the positive and negative voltages 310 and 320 are desired to be discharged to target voltage levels 312 and 322, respectively. Once discharge 603 and discharge 605 begin for the erase recovery at start time ($t_{START}$) 330, ending voltage levels 606 and 608 will not reach the target voltage levels 312 and 322 if the end time is too short as represented by too short end time ($t_{SHORT}$) 602. On the other hand, if the discharge rate is too slow, as shown by curves 610 and 612 with respect to end time ($t_{END}$) 604, the ending voltage levels 606 and 608 will still not reach the target voltage levels 312 and 322. These non-target voltage level results are undesirable with respect to the erase recovery operations, and they can cause potential damage to the NVM system.

FIG. 7 is a timing diagram of an embodiment 700 where the negative voltage ($V_{NEG}$) overshoots due to the positive voltage ($V_{POS}$) discharge rate being too fast. As depicted, the positive and negative voltages 310 and 320 are discharged for erase recovery starting at the start time ($t_{START}$) 330. If the discharge rate for the positive voltage ($V_{POS}$) is too fast, as represented by line 702, the negative voltage ($V_{NEG}$) will overshoot (i.e., drop below its initial level) as represented by line 704 before rising towards a target voltage level as represented by line 706. This voltage overshoot results is undesirable with respect to the erase recovery operations and can cause potential damage to the NVM system.

FIG. 8 is a timing diagram of an embodiment 800 where the positive voltage ($V_{POS}$) overshoots due to the positive voltage ($V_{NEG}$) discharge rate being too fast. As depicted, the positive and negative voltages 310 and 320 are discharged for erase recovery starting at the start time ($t_{START}$) 330. If the discharge rate for the negative voltage ($V_{NEG}$) is too fast, as represented by line 802, the positive voltage ($V_{POS}$) will overshoot (i.e., rise above its initial level) as represented by line 804 before falling towards a target voltage level as represented by line 806. This voltage overshoot results is undesirable with respect to the erase recovery operations and can cause potential damage to the NVM system.

Advantageously, the adaptive control of erase recovery provided by the disclosed embodiments avoid non-target voltage level and voltage overshoot problems. As described herein, erase recovery discharge circuitry is adjusted based upon the number of NVM cells to be recovered and/or the operating temperature of the NVM system so that discharge rates and/or discharge times are applied that achieve desired target voltages during erase recovery.

As described herein, a variety of embodiments can be implemented and different features and variations can be implemented, as desired.

One disclosed embodiment is a method for adaptive erase recovery of non-volatile memory (NVM) cells, including applying one or more erase pulses to non-volatile memory (NVM) cells within an NVM system, selecting a discharge rate for an erase recovery operation based upon a number of NVM cells to be recovered, adjusting discharge circuitry based upon the selected discharge rate, and performing an erase recovery operation on the NVM cells to be recovered using the adjusted discharge circuitry.

In further embodiments, the performing step can further include using the adjusted discharge circuitry to discharge gate nodes and body nodes for the NVM cells to be recovered. Still further, the gate nodes can be discharged from a first voltage level to a second voltage level with smaller magnitude, and the body nodes are discharged form a third voltage level to a fourth voltage level with a smaller magnitude. In addition, a single discharge rate can be utilized to discharge the gate nodes and the body nodes. Further, where an NVM block is being erased, and the performing step can be applied to all NVM cells in the NVM block being erased. In addition, the adjusting step can include applying a multiple bit control signal to the discharge circuitry to adjust the discharge rate.

For other embodiments, the method can further include selecting a maximum allowed discharge time based upon a number of NVM cells to be recovered, and the erase recovery operation can be performed for a time period based upon the selected discharge time. Further, the selecting step can include selecting the discharge rate and the discharge time based also upon an operating temperature associated with the NVM system. Still further, the selecting step can include accessing a lookup table storing discharge rates and discharge times associated with numbers of NVM cells to be recovered and operating temperatures. In addition, the selecting step can further include selecting smaller discharge rates and longer discharge times as a number of NVM cells to be recovered increases.

Another disclosed embodiment is a non-volatile memory (NVM) system, including a plurality of non-volatile memory (NVM) cells within an NVM system, discharge circuitry coupled to the NVM cells, an erase recovery lookup table configured to store discharge rates associated with numbers of NVM cells to be recovered, and controller circuitry. The controller circuitry is further configured to apply one or more erase pulses to the NVM cells, to select a discharge rate from the erase recovery lookup table based upon a number of NVM cells to be recovered, to adjust the discharge circuitry based upon the selected discharge rate, and to perform an erase recovery operation with respect to the NVM cells to be recovered using the adjusted discharge circuitry.

In further embodiments, the discharge circuitry can be configured to discharge gate nodes and body nodes for the NVM cells to be recovered. Still further, the erase recovery operation can be configured to discharge the gate nodes from a first voltage level to a second voltage level with smaller magnitude and to discharge the body nodes form a third voltage level to a fourth voltage level with smaller magnitude. In addition, the controller circuitry can be configured to select a single discharge rate to discharge the gate nodes and the body nodes.

For other embodiments, the erase recovery lookup table can be further configured to store discharge times associated with numbers of NVM cells to be recovered, and the controller circuitry can be further configured to select a discharge time from the erase recovery lookup table based upon a number of NVM cells to be recovered and to perform the erase recovery operation for a time period based upon the selected discharge time. Further, the discharge rates and discharge times within the erase recovery lookup table can be further associated operating temperatures, and the controller circuitry can be further configured to select the discharge rate and the discharge time based also upon an operating temperature associated with the NVM system. Still further, the lookup table can be stored within a dedicated block of NVM cells within the NVM system.

For still further embodiments, the controller circuitry can be configured to apply one or more multiple bit control signals to the discharge circuitry to adjust the discharge rate. Further, a first multiple bit control signal can be configured to determine which of a first plurality of discharge transistors are used within the discharge circuitry to control a positive voltage discharge, and a second multiple bit control signal can be configured to determine which of a second plurality of discharge transistors are used within the discharge circuitry to control a negative voltage discharge. Still further, the first plurality of discharge transistors can be weighted with respect to each other, and the second plurality of discharge transistors can be weighted with respect to each other.

It is noted that the functional blocks described herein can be implemented using hardware, software or a combination of hardware and software, as desired. In addition, one or more processors or microcontrollers running software and/or firmware can also be used, as desired, to implement the disclosed embodiments. It is further understood that one or more of the tasks, functions, or methodologies described herein may be implemented, for example, as software or firmware and/or other instructions embodied in one or more non-transitory tangible computer readable mediums that are executed by a controller, microcontroller, processor, microprocessor, or other suitable processing circuitry.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for adaptive erase recovery of non-volatile memory (NVM) cells, comprising:
    applying one or more erase pulses to non-volatile memory (NVM) cells within an NVM system;
    selecting a discharge rate for an erase recovery operation based upon a number of NVM cells to be recovered;
    adjusting discharge circuitry based upon the selected discharge rate; and
    performing an erase recovery operation on the NVM cells to be recovered using the adjusted discharge circuitry to discharge gate nodes and body nodes for the NVM cells to be recovered.

2. The method of claim 1, wherein the gate nodes are discharged from a first voltage level to a second voltage level with smaller magnitude and wherein the body nodes are discharged form a third voltage level to a fourth voltage level with a smaller magnitude.

3. The method of claim 1, wherein a single discharge rate is utilized to discharge the gate nodes and the body nodes.

4. A method for adaptive erase recovery of non-volatile memory (NVM) cells, comprising:
    applying one or more erase pulses to non-volatile memory (NVM) cells within an NVM system;
    selecting a discharge rate for an erase recovery operation based upon a number of NVM cells to be recovered;
    selecting a maximum allowed discharge time based upon a number of NVM cells to be recovered;
    adjusting discharge circuitry based upon the selected discharge rate; and
    performing an erase recovery operation on the NVM cells to be recovered using the adjusted discharge circuitry for a time period based upon the selected discharge time.

5. The method of claim 4, wherein the selecting step further comprises selecting the discharge rate and the discharge time based also upon an operating temperature associated with the NVM system.

6. The method of claim 4, wherein the selecting step further comprises accessing a lookup table storing discharge rates and discharge times associated with numbers of NVM cells to be recovered.

7. The method of claim 4, wherein the selecting step comprises selecting smaller discharge rates and longer discharge times as a number of NVM cells to be recovered increases.

8. The method of claim 1, wherein an NVM block is being erased, and wherein the performing step is applied to all NVM cells in the NVM block being erased.

9. A method for adaptive erase recovery of non-volatile memory (NVM) cells, comprising:
applying one or more erase pulses to non-volatile memory (NVM) cells within an NVM system;
selecting a discharge rate for an erase recovery operation based upon a number of NVM cells to be recovered;
adjusting discharge circuitry based upon the selected discharge rate by applying a multiple bit control signal to the discharge circuitry to adjust the discharge rate; and
performing an erase recovery operation on the NVM cells to be recovered using the adjusted discharge circuitry.

10. A non-volatile memory (NVM) system, comprising:
a plurality of non-volatile memory (NVM) cells within an NVM system;
discharge circuitry coupled to the NVM cells;
an erase recovery lookup table configured to store discharge rates associated with numbers of NVM cells to be recovered; and
controller circuitry configured to apply one or more erase pulses to the NVM cells, to select a discharge rate from the erase recovery lookup table based upon a number of NVM cells to be recovered, to adjust the discharge circuitry based upon the selected discharge rate, and to perform an erase recovery operation with respect to the NVM cells to be recovered using the adjusted discharge circuitry.

11. The NVM system of claim 10, wherein the discharge circuitry is configured to discharge gate nodes and body nodes for the NVM cells to be recovered.

12. The NVM system of claim 11, wherein the erase recovery operation is configured to discharge the gate nodes from a first voltage level to a second voltage level with smaller magnitude and to discharge the body nodes form a third voltage level to a fourth voltage level with smaller magnitude.

13. The NVM system of claim 11, wherein controller circuitry is configured to select a single discharge rate to discharge the gate nodes and the body nodes.

14. The NVM system of claim 10, wherein the erase recovery lookup table is further configured to store discharge times associated with numbers of NVM cells to be recovered, and wherein the controller circuitry is further configured to select a discharge time from the erase recovery lookup table based upon a number of NVM cells to be recovered and to perform the erase recovery operation for a time period based upon the selected discharge time.

15. The NVM system of claim 14, wherein the discharge rates and discharge times within the erase recovery lookup table are further associated with operating temperatures, and wherein the controller circuitry is further configured to select the discharge rate and the discharge time based also upon an operating temperature associated with the NVM system.

16. The NVM system of claim 10, wherein the lookup table is stored within a dedicated block of NVM cells within the NVM system.

17. The NVM system of claim 10, wherein the controller circuitry is configured to apply one or more multiple bit control signals to the discharge circuitry to adjust the discharge rate.

18. The NVM system of claim 17, wherein a first multiple bit control signal is configured to determine which of a first plurality of discharge transistors are used within the discharge circuitry to control a positive voltage discharge and a second multiple bit control signal is configured to determine which of a second plurality of discharge transistors are used within the discharge circuitry to control a negative voltage discharge.

19. The NVM system of claim 18, wherein the first plurality of discharge transistors are weighted with respect to each other, and wherein the second plurality of discharge transistors are weighted with respect to each other.

20. The method of claim 1, wherein the selecting step further comprises accessing a lookup table storing discharge rates associated with numbers of NVM cells to be recovered.

* * * * *